United States Patent [19]
Fuerhoff

[11] Patent Number: 5,882,402
[45] Date of Patent: Mar. 16, 1999

[54] METHOD FOR CONTROLLING GROWTH OF A SILICON CRYSTAL

[75] Inventor: Robert H. Fuerhoff, St. Charles, Mo.

[73] Assignee: MEMC Electronic Materials, Inc., St. Peters, Mo.

[21] Appl. No.: 939,802

[22] Filed: Sep. 30, 1997

[51] Int. Cl.$^6$ .................................................. C30B 1/00
[52] U.S. Cl. ........................... 117/201; 117/13; 117/202; 117/208; 117/932
[58] Field of Search ............... 117/201, 14, 13, 117/203, 202, 208, 932

[56] References Cited

U.S. PATENT DOCUMENTS

| | | | |
|---|---|---|---|
| 3,692,499 | 9/1972 | Anchychuck | 23/301 |
| 3,740,563 | 6/1973 | Reichard | 250/222 R |
| 4,242,589 | 12/1980 | Sachs | 250/577 |
| 4,277,441 | 7/1981 | Sachs | 422/105 |
| 4,330,524 | 5/1982 | Grabmaier | 423/593 |
| 4,350,557 | 9/1982 | Scholl et al. | 156/601 |
| 4,710,258 | 12/1987 | Latka | 156/601 |
| 4,794,263 | 12/1988 | Katsuoka . | |
| 4,926,357 | 5/1990 | Katsuoka et al. | 364/560 |
| 5,138,179 | 8/1992 | Baba | 250/560 |
| 5,170,061 | 12/1992 | Baba | 250/561 |
| 5,176,787 | 1/1993 | Kawashima | 156/601 |
| 5,178,720 | 1/1993 | Frederick | 156/618.1 |
| 5,183,528 | 2/1993 | Baba et al. | 156/601 |
| 5,240,684 | 8/1993 | Baba et al. | 422/249 |
| 5,288,363 | 2/1994 | Araki | 156/601 |
| 5,378,900 | 1/1995 | Hirano et al. | 117/201 |
| 5,437,242 | 8/1995 | Hofstetter et al. | 117/14 |
| 5,454,346 | 10/1995 | Uchida | 117/13 |
| 5,477,805 | 12/1995 | Izunome | 117/13 |
| 5,653,799 | 8/1997 | Fuerhoff | 117/14 |
| 5,656,078 | 8/1997 | Fuerhoff | 117/201 |
| 5,665,159 | 9/1997 | Fuerhoff | 117/201 |
| 5,676,751 | 10/1997 | Banan | 117/13 |

FOREIGN PATENT DOCUMENTS

0450502A1  10/1991  European Pat. Off. ........ C30B 15/26

OTHER PUBLICATIONS

Gonzalez and Wintz, Digital Image Processing, 1987, pp. 36–52.
L. Stahlbert, Subpixel Accuracy, Gauging and Flaw Detection in Machine Vision, Sensors, May 1995.

*Primary Examiner*—R. Bruce Breneman
*Attorney, Agent, or Firm*—Senniger, Powers, Leavitt & Roedel

[57] ABSTRACT

A method and system for determining a diameter of a silicon single crystal being pulled from a silicon melt contained in a heated crucible. The melt has a surface with a meniscus visible as a bright area adjacent the pulled crystal. A camera generates an image of the interior of the crucible including a portion of the bright area adjacent the crystal. Image processing circuitry defines a central window region of the image having an elliptical shape at a position corresponding to an approximate center of the crystal and processes the image as a function of its pixel values to detect edges within the central window region. The image processing circuitry further groups the detected edges to define an object in the image corresponding to the crystal, determines a dimension of the defined object and determines an approximate diameter of the crystal as a function of the determined dimension of the defined object.

21 Claims, 8 Drawing Sheets

METHOD FOR CONTROLLING GROWTH OF A SILICON CRYSTAL

NOTICE

Copyright© 1997 MEMC Electronic Materials, Inc. A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

This invention relates generally to improvements in controlling the Czochralski process for growing silicon crystals and, particularly, to a vision system and method for measuring parameters of the silicon crystals and the silicon crystal growth process for use in controlling the growth process based on the measured parameters.

Most processes for fabricating semiconductor electronic components use monocrystalline, or single crystal, silicon as a starting material. Crystal pulling machines employing the Czochralski process produce the majority of single crystal silicon. Briefly described, the Czochralski process involves melting a charge of high-purity polycrystalline silicon, or polysilicon, in a quartz crucible which is located in a specifically designed furnace. After the silicon in the crucible is melted, a crystal lifting mechanism lowers a seed crystal into contact with the molten silicon. When the seed begins to melt, the mechanism pulls a growing crystal from the silicon melt by slowly withdrawing the seed from the melt.

After formation of a crystal neck, the process enlarges the diameter of the growing crystal by decreasing the pulling rate and/or the melt temperature until a desired diameter is reached. By controlling the pull rate and the melt temperature while compensating for the decreasing melt level, the main body of the crystal is grown so that it has an approximately constant diameter (i.e., it is generally cylindrical). Near the end of the growth process but before the crucible is emptied of molten silicon, the process gradually reduces the crystal diameter to form an end cone. Typically, the end cone is formed by increasing the crystal pull rate and heat supplied to the crucible. When the diameter becomes small enough, the crystal is then separated from the melt. During the growth process, the crucible rotates the melt in one direction and the crystal lifting mechanism rotates its pulling cable or shaft, the seed and the crystal in an opposite direction.

Although the conventional Czochralski growth process has been satisfactory for growing single crystal silicon useful in a wide variety of applications, further improvements in the quality of the semiconductor material are desirable. For example, the Czochralski process is controlled in part as a function of the diameter of the crystal being grown. Thus, an accurate and reliable system for measuring crystal diameter during the different phases of crystal growth is needed to ensure crystal quality.

Commonly assigned U.S. Pat. Nos. 5,665,159 and 5,653,799, the entire disclosures of which are incorporated herein by reference, describe a system and method, respectively, for accurately and reliably measuring crystal diameter for use in controlling the growth process of single crystal silicon. Advantageously, the system and method of these patents accurately determine the growing crystal's diameter by processing images of the crystal-melt interface generated by a camera.

Further improvements, however, are still desired. For example, the detection of false targets compromises the ability to measure the crystal diameter. Improvement is also desired to compensate for the different possible camera locations. Likewise, a redundant system is desired to reduce the possibility of a loss of diameter sensing.

In addition, hot zone apparatus is often disposed within the crucible for thermal and/or gas flow management purposes. For example, a heat shield is sometimes used to form a partial thermal cavity in the crucible for conserving heat lost from the free melt surface at the liquid-gas-solid interface. Unfortunately, hot zone apparatus can interfere with accurate and reliable diameter measurements by obscuring the camera's view of the growing crystal.

For these reasons, an improved system and method for the measurement and control of crystal diameter in the Czochralski process is desired.

SUMMARY OF THE INVENTION

The invention meets the above needs and overcomes the deficiencies of the prior art by providing an improved method and system of control and operation. This is accomplished by a vision system which avoids false targets due to hot zone apparatus, for example, while performing edge detection routines and which permits measuring a crystal's diameter even when the edges of the crystal's bright ring are not detected in at least three window regions of the image for circle-fitting. In addition, such method can be carried out efficiently and economically and such system is economically feasible and commercially practical.

Briefly described, a method embodying aspects of the present invention is for use with an apparatus for growing a silicon single crystal. The crystal growing apparatus has a heated crucible containing a silicon melt from which the crystal is pulled and the melt has a surface with a meniscus visible as a bright area adjacent the pulled crystal. The method determines a diameter of the crystal and begins with the step of generating an image of the interior of the crucible including a portion of the bright area adjacent the crystal. The method also includes defining a central window region of the image at a position corresponding to an approximate center of the crystal and processing the image as a function of its pixel values to detect edges within the central window region. According to the present method, the central window region has an elliptical shape. The method further includes the steps of grouping the detected edges to define an object in the image corresponding to the crystal, determining a dimension of the defined object and determining an approximate diameter of the crystal as a function of the determined dimension of the defined object.

Generally, another form of the invention is a system for use with an apparatus for growing a silicon single crystal. The crystal growing apparatus has a heated crucible containing a silicon melt from which the crystal is pulled and the melt has a surface with a meniscus visible as a bright area adjacent the pulled crystal. The system determines a diameter of the crystal and includes a camera for generating an image of the interior of the crucible including a portion of the bright area adjacent the crystal and an image processor for processing the image. The image processor includes a defining circuit for defining a central window region of the image at a position corresponding to an approximate center of the crystal. The central window regions has an elliptical shape. The image processor also includes a detection circuit for processing the image as a function of its pixel values to detect edges within the central window region and for grouping the detected edges to define an object in the image corresponding to the crystal. The image processor further includes a measurement circuit for determining a dimension of the defined object and determining an approximate diameter of the crystal as a function of the determined dimension of the defined object.

Alternatively, the invention may comprise various other methods and systems.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
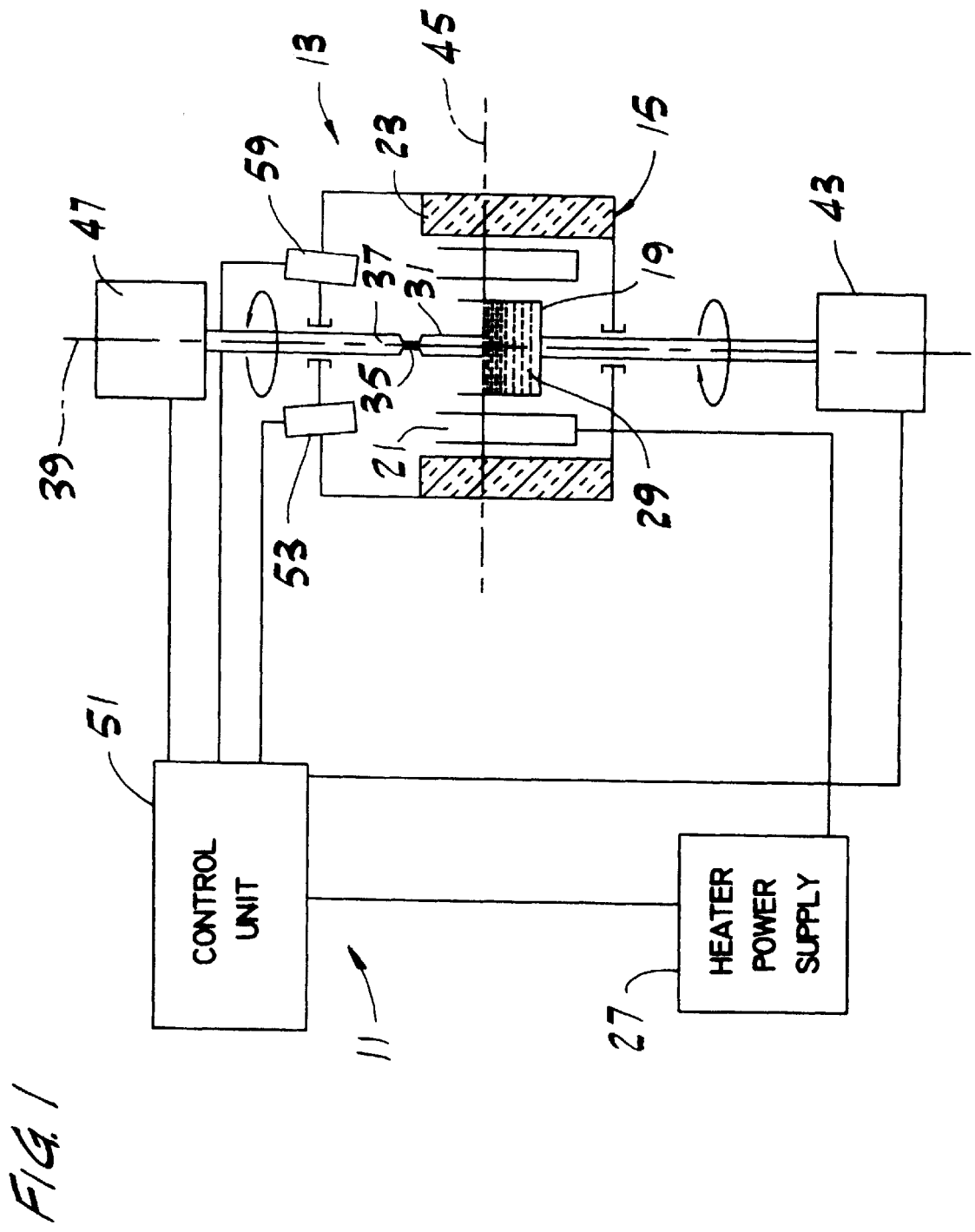
FIG. 1 is an illustration of a crystal growing apparatus and a system for controlling the crystal growing apparatus according to a preferred embodiment of the invention.

Referring now to FIG. 1, a system 11 is shown for use with a Czochralski crystal growing apparatus 13. In the illustrated embodiment, the crystal growing apparatus 13 includes a vacuum chamber 15 enclosing a crucible 19. Heating means such as a resistance heater 21 surrounds the crucible 19. In one embodiment, insulation 23 lines the inner wall of vacuum chamber 15 and a chamber cooling jacket (not shown) fed with water surrounds it. Typically, a vacuum pump (not shown) removes gas from within the vacuum chamber 15 as an inert atmosphere of argon gas is fed into it.

According to the Czochralski single crystal growth process, a quantity of polycrystalline silicon, or polysilicon, is charged to crucible 19. A heater power supply 27 provides electric current through the resistance heater 21 to melt the charge and, thus, form a silicon melt 29 from which a single crystal 31 is pulled. As is known in the art, the single crystal 31 starts with a seed crystal 35 attached to a pull shaft or cable 37. As shown in FIG. 1, single crystal 31 and crucible 19 generally have a common axis of symmetry 39.

During both heating and crystal pulling, a crucible drive unit 43 rotates crucible 19 (e.g., in the clockwise direction). The crucible drive unit 43 also raises and lowers crucible 19 as desired during the growth process. For example, crucible drive unit 43 raises crucible 19 as the melt 29 is depleted to maintain its level, indicated by reference character 45, at a desired height. A crystal drive unit 47 similarly rotates the cable 37 in a direction opposite the direction in which crucible drive unit 43 rotates crucible 19. In addition, the crystal drive unit 47 raises and lowers crystal 31 relative to the melt level 45 as desired during the growth process.

In one embodiment, crystal growth apparatus 13 preheats the seed crystal 35 by lowering it nearly into contact with the molten silicon of melt 29 contained by crucible 19. After preheating, crystal drive unit 47 continues to lower seed crystal 35 via cable 37 into contact with melt 29 at its melt level 45. As seed crystal 35 melts, crystal drive unit 47 slowly withdraws, or pulls, it from the melt 29. As it is withdrawn, seed crystal 35 draws silicon from melt 29 to produce a growth of silicon single crystal 31. Crystal drive unit 47 rotates crystal 31 at a reference rate as it pulls crystal 31 from melt 29. Crucible drive unit 43 similarly rotates crucible 19 at another reference rate, but usually in the opposite direction relative to crystal 31.

A control unit 51 initially controls the withdrawal rate and the power that power supply 27 provides to heater 21 to cause a neck down of crystal 31. Preferably, crystal growth apparatus 13 grows the crystal neck at a substantially constant diameter as seed crystal 35 is drawn from melt 29. For example, the control unit 51 maintains a substantially constant neck diameter of about fifteen percent of the desired diameter. After the neck reaches a desired length, control unit 51 then adjusts the rotation, pull and/or heating parameters to cause the diameter of crystal 31 to increase in a cone-shaped manner until a desired crystal body diameter is reached. Once the desired crystal diameter is reached, control unit 51 controls the growth parameters to maintain a relatively constant diameter as measured by system 11 until the process approaches its end. At that point, the pull rate and heating are usually increased for decreasing the diameter to form a tapered portion at the end of single crystal 31. Commonly assigned U.S. Pat. No. 5,178,720, the entire disclosure of which is incorporated herein by reference, discloses one preferred method for controlling crystal and crucible rotation rates as a function of the crystal diameter.

Preferably, control unit 51 operates in combination with at least one two-dimensional camera 53 to determine a plurality of parameters of the growth process. For example, the camera 53 is a monochrome charge coupled device (CCD) array camera, such as a Sony ® XC-75 CCD video camera having a resolution of 768×494 pixels. Another suitable camera is a JAVELIN® SMARTCAM JE camera. Camera 53 is mounted above a viewport (not shown) of chamber 15 and aimed generally at the intersection of the longitudinal axis 39 and the melt level 45 (see FIG. 3). For example, the operator of crystal growing apparatus 13 positions camera 53 at an angle of approximately 34° with respect to the substantially vertical axis 39.

According to the invention, camera 53 generates video images of the interior of crucible 19 during the growth process of crystal 31. The images generated by camera 53 preferably include a portion of a meniscus 55 (see FIG. 3) at the interface between melt 29 and crystal 31. In one preferred embodiment, camera 53 is equipped with a lens (e.g., 16 mm) providing a relatively wide field of view (e.g., approximately 300 mm or more). For example, the lens may be a telephoto lens providing improved viewing of the melt-crystal interface. Melt 29 and crystal 31 are essentially self-illuminating and provide light for camera 53 without the use of an external light source. It is to be understood that additional cameras may also be used to provide differing fields of view.

In addition to processing signals from camera 53, control unit 51 processes signals from other sensors. For example, a temperature sensor 59, such as a photo cell, may be used to measure the melt surface temperature.

Figure 2:
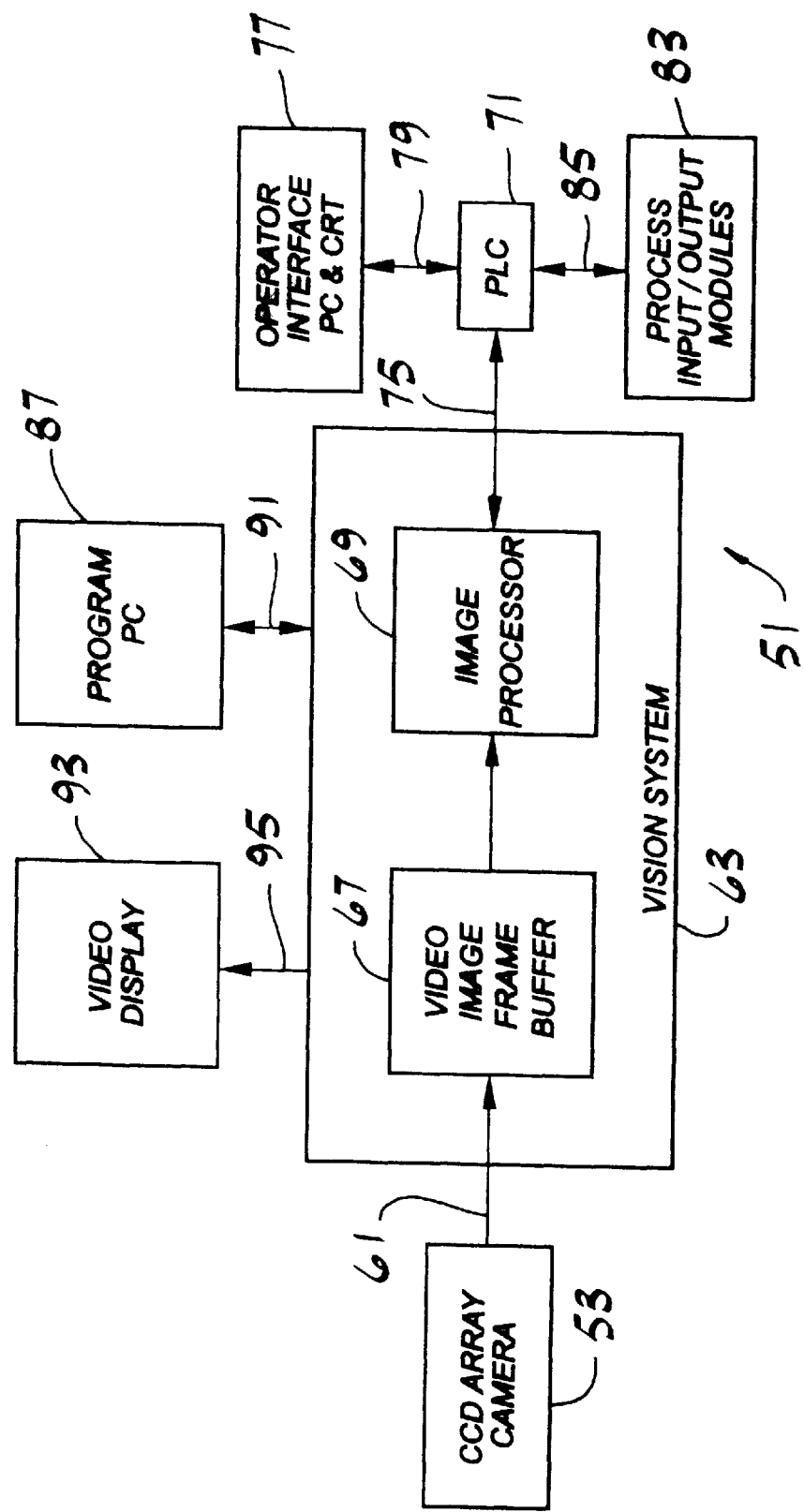
FIG. 2 is a block diagram of a control unit of the system of FIG. 1.

FIG. 2 illustrates a preferred embodiment of control unit 51 in block diagram form. Camera 53 communicates video images of the interior of crucible 19 via line 61 (e.g., RS-170 video cable) to a vision system 63. As shown in FIG. 2, the vision system 63 includes a video image frame buffer 67 and an image processor 69 for capturing and processing the video image. In turn, vision system 63 communicates with a programmable logic controller (PLC) 71 via line 75. As an example, vision system 63 is a CX-100 IMAGENATION Frame Grabber or a COGNEX® CVS-4400 vision system. In one preferred embodiment, the PLC 71 is a Model 575 PLC or a Model 545 PLC manufactured by TEXAS INSTRUMENTS® and line 75 represents a communications interface (e.g., VME backplane interface). Depending on the particular controller embodying PLC 71, the communications interface 75 may be, for example, a custom VME rack which includes an additional communications board (e.g., Model 2571 Program Port Expander Module using the RS-422 serial bidirectional PLC port).

Control unit 51 also includes a programmed digital or analog computer 77 for use in controlling, among other things, crucible drive unit 43, single crystal drive unit 47 and heater power supply 27 as a function of processed signals from camera 53. As shown in FIG. 2, PLC 71 communicates with the computer 77 via line 79 (e.g., RS-232 cable) and with one or more process input/output modules 83 via line 85 (e.g., RS-485 cable). According to the invention, computer 77 provides an operator interface which permits the operator of crystal growing apparatus 13 to input a set of desired parameters for the particular crystal being grown.

In one embodiment, vision system 63 also communicates with a personal computer 87 via line 91 (e.g., RS-232 cable) as well as a video display 93 via line 95 (e.g., RS-170 RGB video cable). The video display 93 displays the video image generated by camera 53 and the computer 87 is used to program vision system 63. In the alternative, computers 77, 87 may be embodied by a single computer for programming the crystal growth process automation and providing an operator interface. Further, it is to be understood that vision system 63 as embodied by certain systems may include its own computer (not shown) or may be used in combination with the personal computer 77 for processing the captured images.

The process input/output module 83 provides a path to and from crystal growing apparatus 13 for controlling the growth process. As an example, PLC 71 receives information regarding the melt temperature from temperature sensor 59 and outputs a control signal to heater power supply 27 via process input/output module 83 for controlling the melt temperature thereby controlling the growth process.

Figure 3:
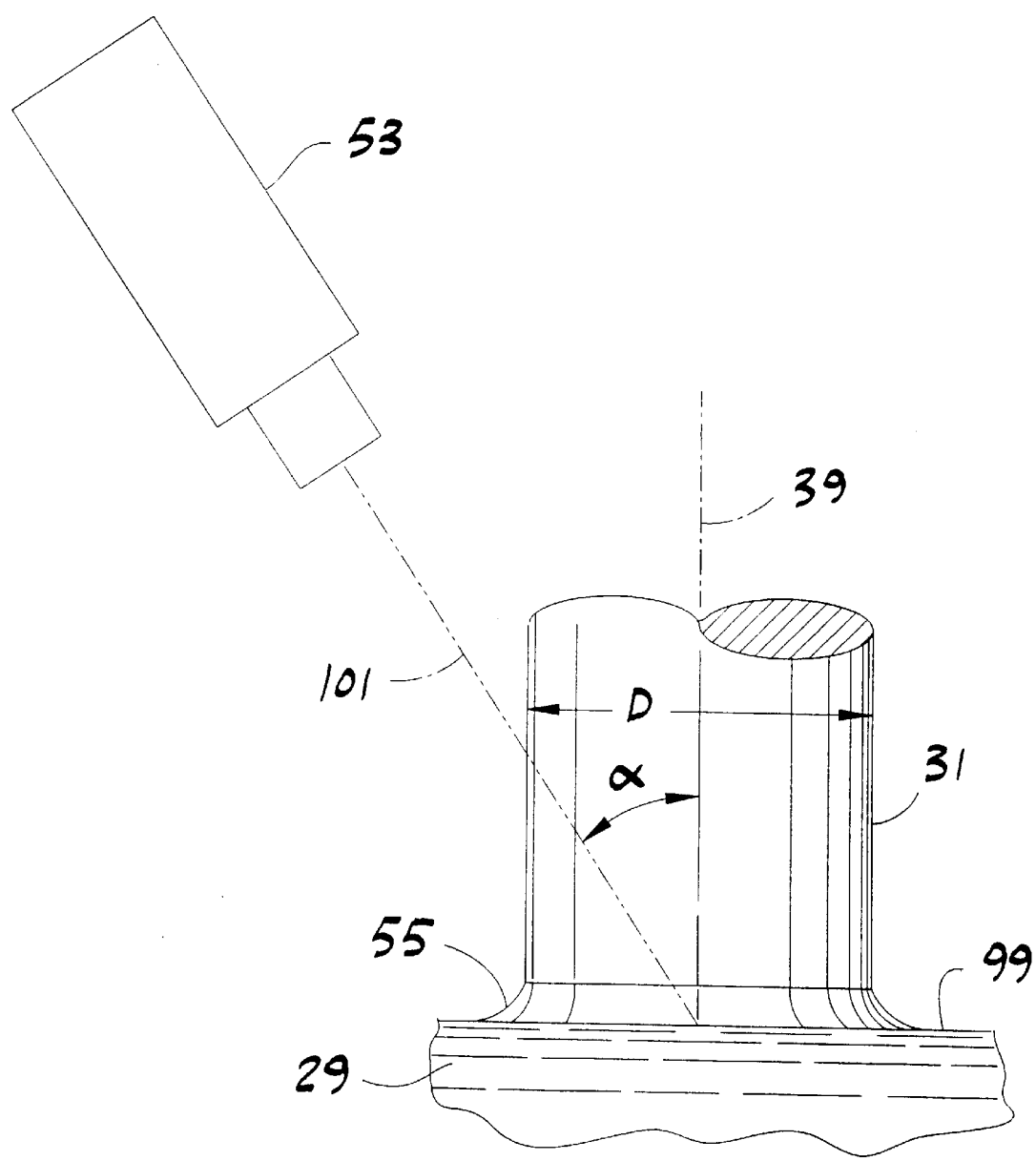
FIG. 3 is a fragmentary view of a silicon crystal being pulled from a melt contained in the crystal growing apparatus of FIG. 1.

FIG. 3, a fragmentary view of silicon crystal 31 being pulled from melt 29, illustrates a later phase of the crystal growth process following melt-down and dipping of seed crystal 35. As shown, crystal 31 constitutes a generally cylindrical body of crystalline silicon (i.e., an ingot) having a diameter D. It should be understood that an as-grown crystal, such as crystal 31, typically will not have a uniform diameter, although it is generally cylindrical. For this reason, diameter D may vary slightly at different axial positions along axis 39. Further, diameter D will vary in the different phases of crystal growth (e.g., seed, neck, crown, shoulder, body and end cone).

FIG. 3 also illustrates a surface 99 of melt 29 having the liquid meniscus 55 formed at the interface between crystal 31 and melt 29. As is known in the art, the reflection of crucible 19 on meniscus 55 is often visible as a bright ring adjacent crystal 31. As described above, camera 53 is mounted in a viewport of chamber 15 and aimed generally at the intersection between axis 39 and the surface 99 of melt 29. As such, an optical axis 101 of camera 53 is at an acute angle $\alpha$ (e.g., $\alpha \approx 15°-350°$) with respect to axis 39. Proper lens and camera selection provides both telephoto viewing for high resolution of small seeds and necks as well as wide angle viewing of the larger body portion of crystal 31. In a preferred embodiment, camera 53 provides a field of view including the width of crystal 31 and at least a portion of the bright ring of meniscus 55. When instructed by PLC 71 to start inspection, the frame buffer 67 of vision system 63 acquires images of the interior of crucible 19 generated by camera 53 at regular intervals (e.g., every one second).

Figure 4:
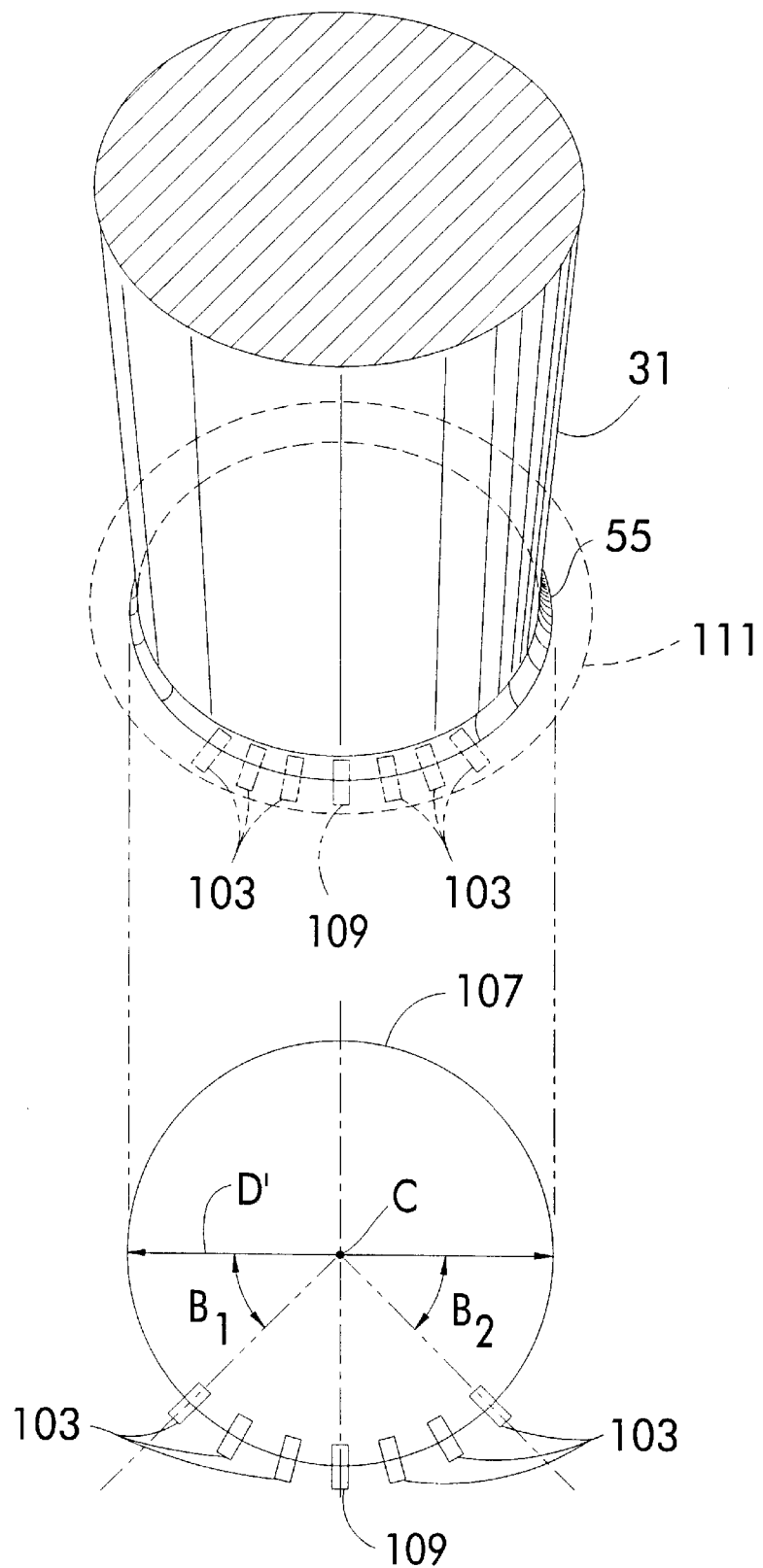
FIG. 4 is a fragmentary and cross-sectional perspective view of the crystal of FIG. 3.

Referring now to FIG. 4, the images of the interior of crucible 19 captured by frame buffer 67 each comprise a plurality of pixels. As is known in the art, each pixel has a value representative of an optical characteristic of the image. For example, the pixel values, or gray levels, correspond to the intensity of the pixels. Image processor 69 defines at least three, and preferably five or more, radial regions of interest 103 on the image and examines the pixels within them for an optical characteristic of the image (e.g., the intensity or gradient of the intensity of the pixels). These radial regions 103 are also referred to as edge tools or window regions. Based on the detected characteristic included in each region 103, image processor 69 detects edges in the image. In the vision system arts, edges are defined as regions in the image where there is a relatively large change in gray level over a relatively small spatial region. It is to be understood that in addition to or instead of intensity or intensity gradient, other optical characteristics of the image, such as color or contrast, may be detected for finding edge coordinates.

According to the invention, image processor 69 defines regions 103 at preselected positions in the images. Preferably, the positions of regions 103 generally correspond to positions along a curve matching the expected shape of the bright ring of meniscus 55 as viewed by camera 53. In other words, regions 103 are positioned radially with respect to a defined center point along the bottom half of an ellipse or circle to approximate the shape of the bright ring. By defining regions 103 at preselected positions approximating the shape of a portion of the bright ring, regions 103 avoid known or expected reflections on the surface 99 of melt 29 that might cause spurious measurements. Also, since image processor 69 defines a number of regions 103, if part of the viewport of chamber 15 is blocked, image processor 69 is still able to detect the edges of the bright ring. In this manner, image processor 69 determines edge coordinates along the outside of the bright ring of meniscus 55 for processing as described below.

FIG. 4 illustrates a set of preferred positions at which regions 103 are defined. As shown, the left-most and right-most regions 103 are preferably located below the y coordinate of the center point C by an angle $\beta_1$, and an angle $\beta_2$, respectively. For example, $\beta_1$ and $\beta_2$ are each approximately 45°. By positioning regions 103 in this manner, system 11 operating in accordance with the present invention is not subject to errors caused when the body of crystal 31 obscures the maximum width of the bright ring as it is viewed through the viewport of chamber 15. Further, system 11 overcomes the problem caused by perspective distortion which is particularly troublesome for large diameter crystals (e.g., 200 mm and larger). In a preferred embodiment of the invention, the angles $\beta_1$ and $\beta_2$ are variable and range from approximately 15° to 50° so that regions 103 span an angle of approximately 80° to 1500°.

As described above, crystal drive unit 47 pulls crystal 31 generally along vertical axis 39 which is generally perpendicular to melt surface 99. During pulling, crystal 31 may move relative to vertical axis 39. Advantageously, regions 103 are large enough so that edge coordinates of the bright ring may be defined within regions 103 even though crystal 31 is moving. Image processor 69 further dynamically moves the preselected positions of regions 103 so that they are adjacent the imaged portion of the bright ring to follow the crystal diameter throughout all phases of growth (e.g., seed, neck, crown, shoulder, body and end cone). In other words, regions 103 track crystal diameters from approximately 4 mm to 320 mm. As is known in the art, however, the bright ring is not always visible during all phases of growth. For example, during growth of the crown portion of crystal 31, the bright ring may be relatively small or not visible. For this reason, system 11 preferably detects the perimeter of the crown which appears as a bright area relative to the intensity of the background of the image. In this instance, the background of the image is representative of melt surface 99. Thus, in the alternative to detecting the bright ring, system 11 detects the bright area associated with the crown of crystal 31.

In a preferred embodiment, the coordinates of the edges of the bright ring detected within regions 103 are mathematically transformed to compensate for perspective distortion and then input into a best-fit circle measurement. For example, image processor 69 uses a Hough transform or least-squares fit to define a circular shape corresponding to the detected edges. According to the invention, image processor 69 defines a generally circular shape 107 having a circle diameter D' and a center point C based on the detected coordinates. Practically, at least three edge coordinates are needed to define circle 107 in this manner.

In order to obtain an accurate measurement of the diameter D of crystal 31 for use by PLC 71 in controlling the crystal growth process, image processor 69 first digitally processes the diameter D' of defined circle 107. Image processor 69 uses the dimensions of circle 107 to determine a number of parameters including the diameter D of crystal 31, the quality of fit of defined circle 107 relative to an exact circle, the center coordinates of circle 107 and the melt level 45. Preferably, image processor 69 digitally filters and processes the diameter D to provide a valid input to control unit 51. For purposes of this application, melt level 45 is defined as the distance from the top of heater 21 to surface 99 of melt 29 and may be determined as a function of the coordinates of center point C. Commonly assigned U.S. Pat. Nos. 5,665,159 and 5,653,799 also describe a preferred system and method, respectively, for measuring melt level based on an image of the melt-crystal interface.

In operation, image processor 69 defines regions 103 adjacent the portion of the bright ring and detects an intensity gradient characteristic of the image within regions 103. Image processor 69 further defines the coordinates of an edge of the bright ring within each region 103 as a function of the detected characteristic and defines generally circular shape 107 including the defined edge coordinates. The diameter D of crystal 31 is then determined based on defined circular shape 107 for use in controlling the crystal growth process. Thus, image processor 69 constitutes a detection circuit, a defining circuit and a measurement circuit and PLC 71 constitutes a control circuit.

Preferably, system 11 measures the diameter D' in radius pixels and provides the crystal diameter D in millimeters. The diameter D' is first converted from radius pixels to millimeters and then a value (e.g., approximately 3 mm) which compensates for the width of the bright ring is subtracted. The diameter D' may also be adjusted by a calibration factor to compensate for variability in the diameter measurement. Such variability is due primarily to changes in the distance between camera 53 and crystal 31 which affect the magnification of the optics. For example, increasing the distance from camera 53 to melt 29 causes crystal 31 to appear smaller which would result in the actual crystal 31 being grown oversized without compensation. These changes in distance can occur from one crystal growth apparatus 13 to another, from one run to another, and even within a single run because of variability in melt level 45. The operator of crystal growth apparatus 13 preferably measures the growing crystal 31 with a telescope that slides on a calibrated track and then inputs a calibration factor via computer 77 so that the determined crystal diameter D equals the measured value. Likewise, the value compensating for the width of the bright ring may also be determined experimentally.

According to the present invention, the number and location of edge detection regions 103 may be varied to accommodate different camera angles and to avoid hot zone apparatus which would otherwise obstruct the camera's view of the melt-crystal interface. In other words, the invention allows for changing the number of regions 103 and for specifying an angle β below the y coordinate of the previously calculated center point C (e.g., at the software compile time or system operation run time). This is in addition to permitting the regions 103 to follow crystal 31 during changes in diameter and during movement (swinging). As described above, image processor 69 defines the edge detection tools (i.e., regions of interest 103) to provide three or more measurements along the outside of the bright ring of meniscus 55. In this instance, image processor 69 positions regions 103 according to a programmable elliptical region, the size and location of which excludes unwanted images. Regions 103 are arranged to avoid spurious readings caused by, for example, known reflections from the melt surface 99 and obstructions from hot zone apparatus of crystal growth apparatus 23. If an edge is not detected by one or more of the tools, image processor 69 measures the circle 107 corresponding to the image of crystal 31 with the remaining three or more valid points.

Advantageously, system 21 provides crystal diameter measurements even when edges are detected in fewer than three of the regions 103 for use by the circle-fitting software. Thus, diameter control will not be lost if a relatively large portion of meniscus 55 is blocked by, for example, hot zone apparatus or the crystal 31 itself (e.g., during unusually severe diameter cut-ins or normal end cone growth). For this purpose, image processor 69 defines a front region of interest 109 on the image in addition to and independent of the radial regions 103 which are used for circle fitting. Preferably, the front region 109 is approximately centered at the front of crystal 31 relative to camera 53. Image processor 69 then examines the pixels within region 109 for an optical characteristic of the image to detect a front edge of the bright ring indicating meniscus 55. By using the last valid calculation of the center point C of the fitted-circle 107, image processor 69 calculates a present circle diameter D' based on the difference between the center and edge y coordinates according to:

$$D' = 2*(y_{center} - y_{edge}).$$

The image processor 69 of vision system 63 then communicates crystal diameter measurements, melt level values, timing signals, control signals and the like to PLC 71 via VME bus 75.

As will be described below, vision system 63 also performs a search for the image of crystal 31 over a fixed portion of the entire camera image (e.g., a central region 111) for use in repositioning edge detection regions 103. For example, a blob tool detection function may be used if a suitable number of edges of the bright ring are not detected in the image. Preferably, the central region 111 is generally elliptical in shape.

Figure 5:
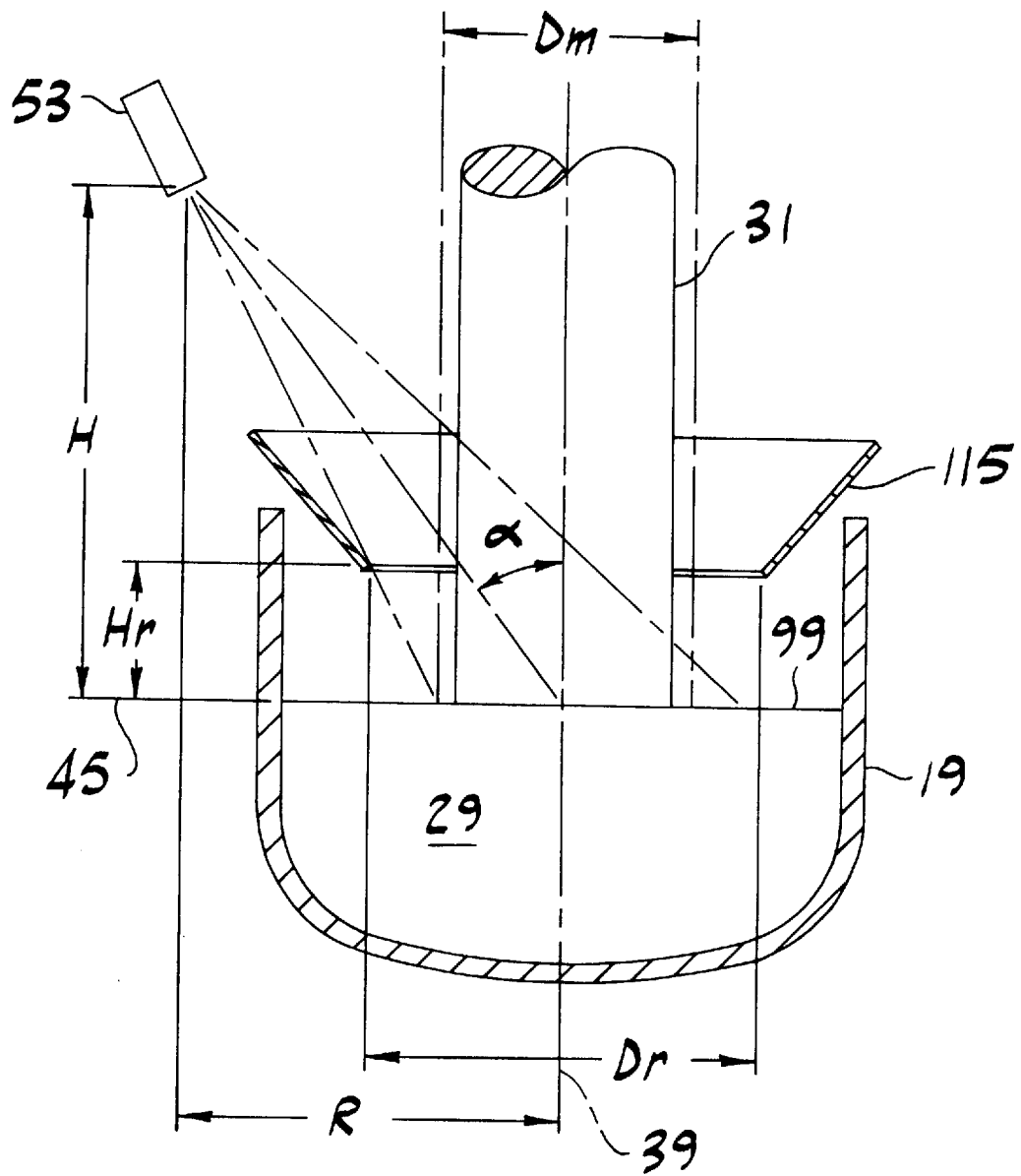
FIG. 5 is a schematic, fragmentary vertical section of the crystal growing apparatus of FIG. 1 showing a reflector assembly as it is positioned during growth of a silicon crystal.

FIG. 5 is a schematic, fragmentary vertical section of the crystal growing apparatus 13 of FIG. 1 showing a reflector assembly 115 as it is positioned during growth of silicon crystal 31. As is known in the art, hot zone apparatus, such as the reflector assembly 115, may also be disposed within crucible 19 for thermal and/or gas flow management purposes. For example, reflector 115 is, in general, a heat shield adapted to retain heat underneath itself and above melt 29. Unfortunately, conventional hot zone apparatus can interfere with accurate and reliable diameters measurements by interfering with the view that camera 53 has of the interface between crystal 31 and melt 29.

In the illustrated embodiment, reflector assembly 115 has a central opening through which crystal 31 is pulled. The position of camera 53, defined by a height H and a radius R, determines the size of the opening needed to prevent the reflector assembly 115 from obstructing the view which camera 53 has of the interface between crystal 31 and melt 29. The maximum undercut of the crystal meniscus 55 determines H and R for which camera 53 is able to view the crystal meniscus 55. Since the parameters H and R are fixed within a limited range by the physical dimensions of crystal growing apparatus 13, this relationship defines a limited range of opening sizes. If the opening in reflector 115 is generally circular, a threshold for its diameter $D_r$ may be determined according to:

$$D_r \geq (2*H_r*R+H*D_m)/H$$

where H is the height of camera 53 above melt surface 99, R is the radial distance of camera 53 relative to axis 39, $H_r$ is the height of reflector 115 above melt surface 99 and $D_m$ is the diameter of meniscus 55 (i.e., $D_m$ corresponds to circle diameter D'). Thus, $D_r$ increases as $H_r$ increases so that reflector assembly 115 will not obstruct the view of camera 53.

Figure 6:
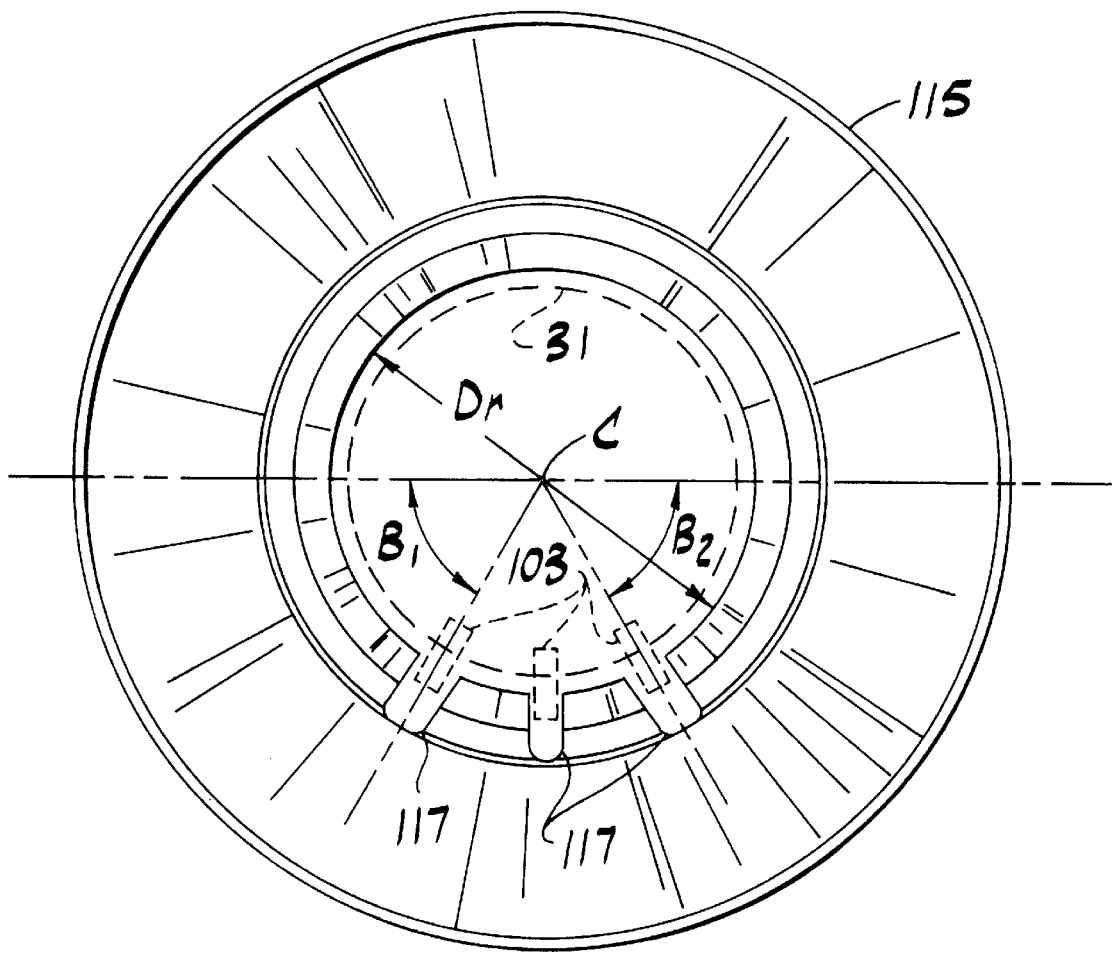
FIG. 6 is a top view of the reflector assembly of FIG. 5.

FIG. 6 is a top view of reflector assembly 115 relative to crystal 31 (shown in phantom). In a preferred embodiment of the invention, reflector 115 has a plurality of passages or notches 117 located about its opening, extending outwardly from the opening in a generally radial manner. As is known in the art, it is desirable to minimize the gap between reflector 115 and crystal 31 to increase the amount of heat reflected back toward melt 29. The notches 117 essentially provide windows through which camera 53 views the crystal-melt interface even though the size of the opening $D_r$ is less than the threshold described above.

In the case of a three-slot reflector such as reflector 115, image processor 69 preferably defines three edge tools corresponding to the notches 117. In other words, image processor 69 defines the positions of regions 103 such that one falls within each notch 117. The positions of regions 103 are programmed after the charge of polysilicon is molten by setting the angle β relative to the line of the center y coordinate via PLC 71 to center each region 103 within a respective notch 117. The edge detection regions 103 can be also rotated in the software, for example, at compile time, or by rotating camera 53 after the charge is molten.

Figure 7A:
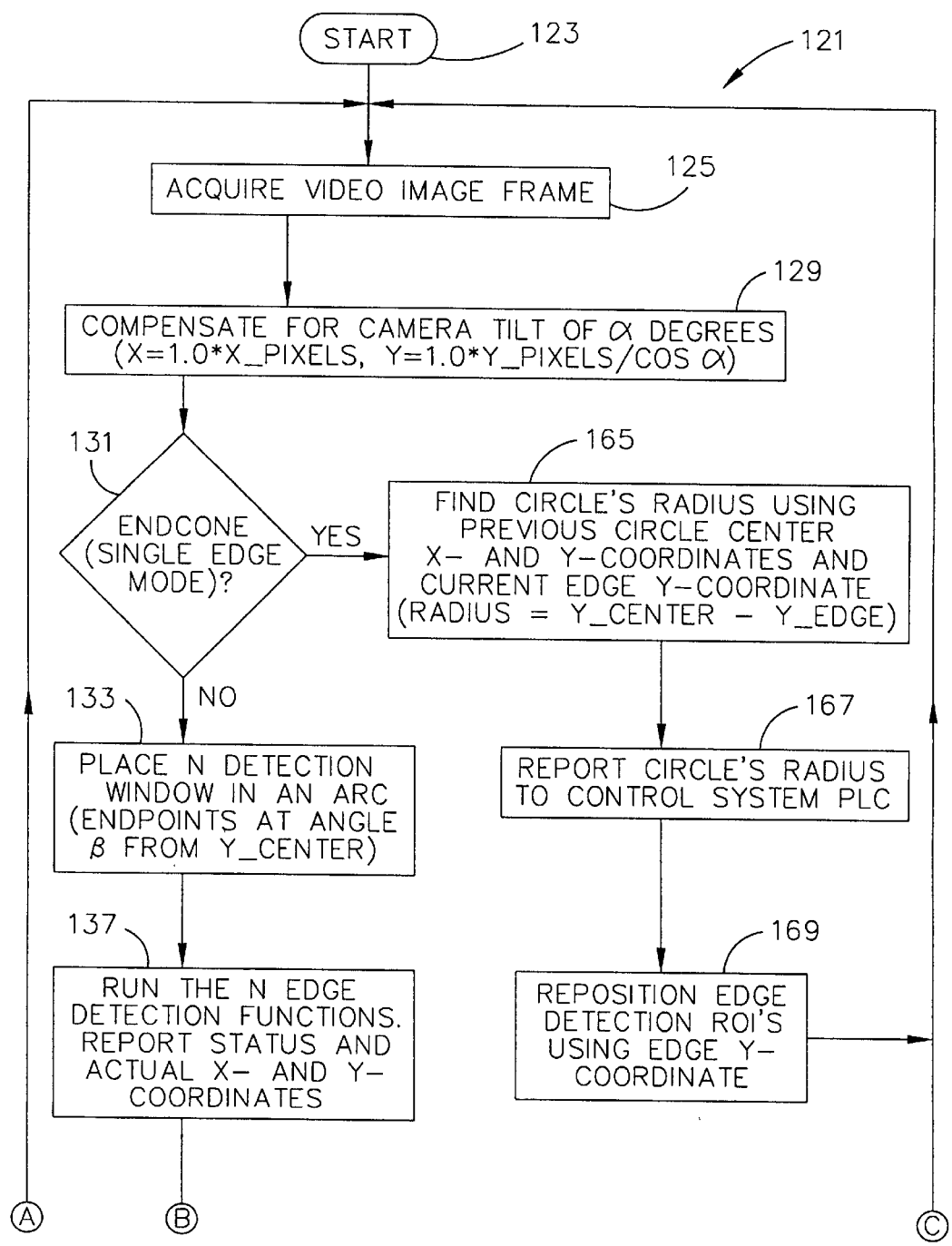
FIGS. 7A and 7B illustrate an exemplary flow diagram of the operation of the control unit of FIG. 2.
Figure 7B:
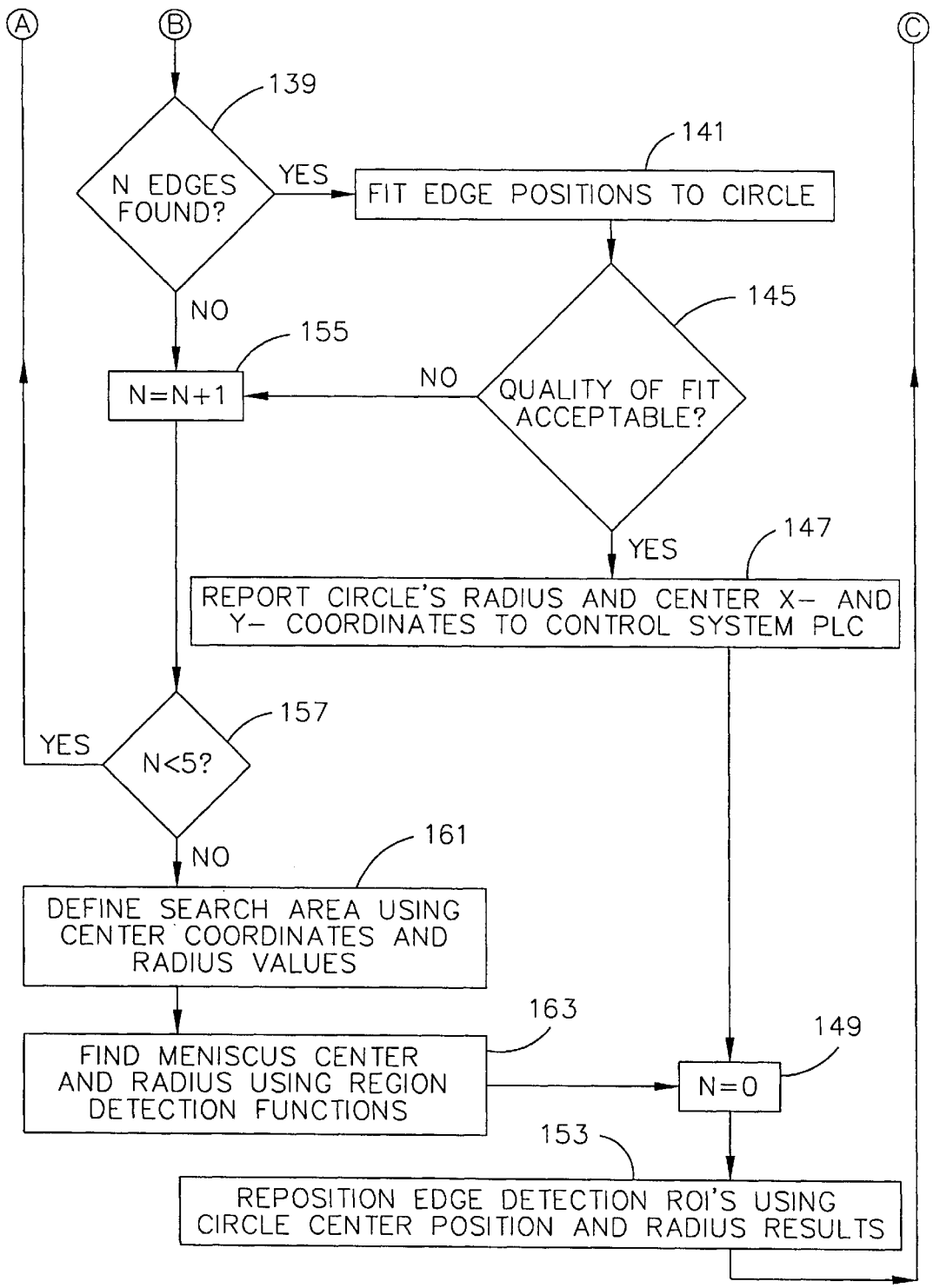

Referring now to FIGS. 7A and 7B, system 11, including control unit 51, operates according to a flow diagram 121 for providing closed loop control of crystal growing apparatus 13. Beginning at step 123, camera 53 generates images of the interior of crucible 19. The frame buffer 67 of vision system 63 captures the images from the video image signal of camera 53 at step 125 for processing by the image processor 69.

At step 129, image processor 69 receives the captured image and adjusts its pixel values to provide a degree of compensation for distortion of the image caused by the camera angle α. Advantageously, step 129 permits camera 53 to be moved within the viewport to avoid, for example, hot zone obstructions. If moved, camera 53 will usually have a different angle relative to axis 39 due to camera 53 being tilted so that its optical axis 101 remains directed at the intersection between axis 39 and melt surface 99. As a result of the camera angle changing, the degree to which a generally circular object (e.g. crystal 31) appears elliptical in the image also changes. By scaling the y values of the image (i.e., $y_{pixel}$) by a variable factor derived from cos α rather than a constant scaling factor, image processor 69 adjusts the image so that the portion of the bright area adjacent crystal 31 is generally arcuate for different camera angles. In this instance, the angle a may be set via PLC 71 while the polysilicon charge in crucible 19 is melting.

Proceeding to step 131, image processor 69 determines whether the growth process is in the end cone phase. If not (e.g., the growth process is in the neck, crown or body phases), image processor 69 proceeds to step 133. At step 133, image processor defines regions 103 radially with respect to a center point C of circle 107. Advantageously, image processor positions regions 103 along an arc, the end points of which are each preferably located below the y coordinate of the center point C by an angle β. By positioning regions 103 in this manner, system 11 operating in accordance with the present invention is not subject to errors caused when the body of crystal 31 obscures the maximum width of the bright ring as it is viewed through the viewport of chamber 15.

Vision system 63 begins edge detection within regions 103 at step 137. At step 137, image processor 69, operating in conjunction with PLC 71, processes the images as a function of the pixel values to detect edges in the images. Preferably, processor 69 performs several routines for analyzing the image, including edge detection routines for analyzing the gray level changes (as a function of image intensity) in a defined region of the image. Various edge detection operators, or algorithms, for finding and counting edges in an image are known to those skilled in the art. For example, suitable edge detection routines include Canny or Hough algorithms. It is to be understood that in addition to intensity, other characteristics of the image, such as intensity gradient, color or contrast, may be used to optically distinguish meniscus 55 or other objects on the surface 99 of melt 29 from melt 29 itself.

During the pulling phases of crystal growth, image processor 69 preferably performs digital edge detection to locate the coordinates of at least three points around the inside or outside of the bright ring of meniscus 55. Since the cross section of crystal 31 and meniscus 55 is known to be generally circular, the bright ring edge coordinates detected by image processor 69 are assumed to be elliptical, transformed and mapped into a circular shape. In the alternative, the edge coordinates can be mapped into a circular shape by compensating for the distortion caused by the angle at which camera 53 is mounted. Gonzalez and Wintz, *Digital Image Fundamentals,* 1987, pages 36–52, incorporated herein by reference, disclose mathematical transformations for compensating for perspective distortion caused by the position of a camera with respect to a three-dimensional object. Such transformations may be used to extract a circular shape from a distorted elliptical shape. Further, commonly assigned U.S. Pat. No. 5,656,078, the entire disclosure of which is incorporated herein by reference, describes a non-distorting camera for use in imaging meniscus 55 without the need for complicated mathematical transformations.

In this instance, image processor 69 of vision system 63 performs edge detection by examining the gradient of the intensity of the pixels within each region of interest 103. The gradient is obtained by taking the derivative of the relative intensity of the image within each region 103. Thus, image processor 69 identifies the coordinates of the greatest change in intensity within each region 103 which is indicative of an edge of the bright ring. At step 139, if N edge coordinates are defined, image processor 69 proceeds to step 141 for fitting the defined edge coordinates to a generally circular shape by means of a circle-fitting algorithm, such as the Hough transform or least-squares fit. For example, the Hough transform uses sorting routines to develop clusters of data points which can be used to find circles and then finds the best cluster of data points for the desired object. The data is then averaged to find the center and radius of a fitted circle.

At step 145, vision system 63 determines the quality of the circle-fit by comparing the defined circular shape 107 to an exact circle. This determination provides an indication of the validity of the measurements. If the defined shape is sufficiently circular, vision system 63 proceeds to step 147 for communicating information representative of the diameter D' of defined circle 107 and the (x,y) coordinates of its center point C to PLC 71 of control unit 51 for use in controlling the crystal growth process. Control unit 51 then executes programs in response to these determined parameters for controlling crystal growing apparatus 13.

Operation of system 11 then proceeds to step 149 where a counter N is set to zero. Image processor 69 then repositions regions 103 at step 153 based on the determined center point and radius before returning to step 125. In this manner, regions 103 are essentially centered on the detected edge of the bright ring of meniscus 55 and image processor 69 responds to movement of crystal 31 during pulling as well as changes in diameter.

If N edge coordinates of the bright ring are not defined within regions 103 at step 139, or if image processor 69 determines at step 145 that the quality of fit is unacceptable, image processor 69 increments the counter N at step 155. Image processor 69 then repeats the previous steps until N=5 at step 157, or until image processor 69 defines an acceptable circle 107. After five, for example, unsuccessful attempts at defining the edge of the bright ring, image processor 69 searches for the general position of the bright ring. At step 161, image processor 69 defines a circular or elliptical search area (i.e., central window region 111) based on the previous center coordinates and circle radius. In other words, region 111 is centered about the approximate center of crystal 31. Image processor 69 then performs a region detection routine within the defined region 111 at step 163. The region detection routine of step 163, in this instance a blob analysis, finds the approximate location of meniscus 55 on the image based on the intensity of the bright ring relative to the intensity of the background of the image which, in this instance, is representative of melt surface 99. Image processor 69 determines an approximate center point and radius for defining the preselected positions of regions 103, resets the counter N at step 149, repositions the window regions 103 at step 153 and then returns to step 125 for restarting the routine.

Preferably, vision system 63 performs its search for the image of crystal 31 over a fixed portion of the entire camera image. For example, the blob tool detection function is used to detect the crystal image in the elliptical region 111 with objects outside of region 111 being ignored. In one embodiment, the x and y coordinates, as well as the diameter, of region 111 are programmed via PLC 71 after the charge of polysilicon in crucible 19 is molten.

As is known in the art, a blob is a connected region in an image and blob analysis involves identification of blobs based on their geometric features (e.g., area, length or the like). In other words, processor 69 performs blob analysis by examining the shape of the object (e.g., the ratio of the object's major and minor axes) or by examining the area of the object itself. Further, the bright ring detection step may include connectivity analysis, which is often included in blob analysis, to group edges detected in the image as a function of their locations in the image (i.e., their coordinates). As an example, Stanford Research Institute developed a set of routines referred to as SRI algorithms used for geometric analysis and identification of blobs. The SRI algorithms include the steps of converting the image to binary, performing connectivity analysis to identify each blob or object, calculating the core statistical features for image objects and calculating additional user selected features.

On the other hand, if image processor 69 determines that the growth process is in the end cone phase, it proceeds to step 165 for calculating an estimated or approximate radius (or diameter) of circle 107. As described above, a relatively large portion of meniscus 55 is blocked by crystal 31 itself during end cone growth. Advantageously, system 11 provides crystal diameter measurements even when edges are detected in fewer than three of the regions 103 for use by the circle-fitting software. Thus, diameter control will not be lost during end cone growth or if a relatively large portion of meniscus 55 is blocked. In this instance, image processor 69 uses the last valid calculation of the center point C of the fitted-circle 107 to calculate a present circle radius based on the difference between the previous center y coordinate and the present edge y coordinate.

At step 167, image processor 69 reports the circle radius measurement to PLC 71 via VME bus 75 and causes the positions of edge detection regions of interest 103 to be adjusted at step 169 to accommodate the new circle radius measurement before returning to step 125 for restarting the routine.

A source of variability in the diameter measurements is that the width of the bright ring changes depending on the height of the hot wall of crucible 19 which is exposed and reflected by liquid meniscus 55. As melt 29 is depleted, the width of the bright ring increases which causes crystal 31 to appear larger and may result in the actual crystal 31 being grown undersized. As an alternative to using a correction constant, the bright ring width can be calculated by using additional vision tools or mathematical modeling. Thus, as an example, detecting the edge between crystal 31 and the bright ring in addition to detecting the edge between melt 29 and the bright ring may be used to provide a measure of bright ring width. Further, mathematical modeling of liquid meniscus 55 taking into account its reflective characteristics with respect to crucible wall height, provides a measure of bright ring width.

In a preferred embodiment, PLC 71 of control unit 51 is responsive to the determined diameter D of silicon crystal 31 for controlling the rates at which crucible 19 and crystal 31 are rotated and/or the rate at which crystal 31 is pulled from melt 29 and/or the temperature of melt 29 and is responsive to the determination of melt level 45 for controlling the level of crucible 19 thereby to control crystal growth apparatus 13. As such, closed loop control is performed in maintaining the crystal diameter including the neck growth phase.

Further, the edge coordinates of meniscus 55 may be used to detect periodic deviations in crystal diameter with respect to the rate at which crystal drive unit 47 rotates crystal 31 as described in commonly assigned U.S. Pat. Nos. 5,665,159 and 5,653,799. By detecting these deviations in diameter, system 11 is able to detect facets, or habit lines, generally parallel to vertical axis 39 and spaced apart along the body of crystal 31. The habit lines, also referred to as growth lines, appear as bump-like features on the perimeter of a cross section of crystal 31 and indicate zero dislocation growth.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A method for use in combination with an apparatus for growing a silicon single crystal, said crystal growing apparatus having a heated crucible containing a silicon melt from which the crystal is pulled, said melt having a surface with a meniscus visible as a bright area adjacent the crystal as the crystal is pulled from the melt, said method for determining a diameter of the crystal, said method comprising the steps of:

generating an image with a camera of the interior of the crucible including a portion of the bright area adjacent the crystal, said image including a plurality of pixels, said pixels each having a value representative of an optical characteristic of the image;

defining a central window region of the image at a position corresponding to an approximate center of the crystal, said central window region having an elliptical shape;

processing the image as a function of the pixel values to detect edges within the central window region;

grouping the detected edges to define an object in the image corresponding to the crystal;

determining a dimension of the defined object; and determining an approximate diameter of the crystal as a function of the determined dimension of the defined object.

2. The method of claim 1 wherein the step of determining the dimension of the defined object comprises defining a center of the object and a width of the object, said center of the object corresponding to the approximate center of the crystal and said width of the object corresponding to the approximate diameter of the crystal.

3. The method of claim 2 further comprising the step of defining a plurality of window regions of the image at positions located radially with respect to the center of the object and at a distance from the center of approximately half the width of the object and the step of processing the image as a function of the pixel values to detect edges within the radial window regions, said edges detected within the radial window regions corresponding to an edge of the bright area adjacent the crystal.

4. The method of claim 3 further comprising the steps of defining a curve corresponding to the shape of the meniscus based on the edges detected within the radial window regions, determining a dimension of the defined curve, and determining the diameter of the crystal as a function of the determined dimension of the defined curve.

5. The method of claim 4 wherein the defined curve represents a circle that fits the edges detected within the radial window regions.

6. The method of claim 5 further comprising the step of moving the radial window regions to positions located radially with respect to the center of the defined circle and at a distance from the center of approximately half the determined diameter of the crystal.

7. The method of claim 4 wherein the crystal is generally cylindrical and the bright area is generally ring-shaped and wherein the step of defining the curve includes defining a circle that includes the edge of the ring-shaped bright area defined within at least three of the radial window regions.

8. The method of claim 4 wherein the crystal is generally cylindrical and the bright area is generally ring-shaped and wherein the step of defining the curve includes defining an ellipse that includes the edge of the ring-shaped bright area defined within at least three of the radial window regions.

9. The method of claim 4 wherein the step of grouping the edges detected within the central window region comprises searching the image for the portion of the bright area thereby to detect the bright area if the edge of the portion of the bright area is not defined within the radial window regions.

10. The method of claim 2 further comprising the steps of defining the approximate center of the crystal with respect to a reference (x,y) coordinate system and defining a plurality of window regions of the image at positions located radially with respect to the defined center of the crystal, at least one of the radial window regions being positioned at an angle $\beta$ below the y coordinate of the defined center wherein $\beta$ is between approximately 15° and approximately 50°, and the step of processing the image as a function of the pixel values to detect edges within the radial window regions, said edges detected within the radial window regions corresponding to an edge of the bright area adjacent the crystal.

11. The method of claim 10 further comprising the steps of defining a curve corresponding to the shape of the meniscus based on the edges detected within the radial window regions, determining a dimension of the defined curve, and determining the diameter of the crystal as a function of the determined dimension of the defined curve.

12. The method of claim 10 wherein the crystal growth apparatus includes a reflector positioned within the crucible above the surface of the melt, said reflector having a central opening through which the crystal is pulled and a plurality of notches extending radially outwardly from the central opening, and wherein the step of defining the radial window regions includes positioning one of the radial window regions within each of the notches.

13. The method of claim 1 wherein the central window region has an area greater than the portion of the bright area.

14. The method of claim 1 wherein the step of grouping the edges detected within the central window region includes performing a blob analysis of the image.

15. The method of claim 1 wherein the crystal growth apparatus includes a reflector positioned within the crucible above the surface of the melt, said reflector having a central opening through which the crystal is pulled, and wherein the central window region has an area less than the size of the central opening.

16. The method of claim 1 further comprising the steps of defining a circle having a radius approximately equal to a distance from the approximate center of the crystal to an edge of the bright ring and determining the diameter of the crystal as a function of the radius of the defined circle.

17. The method of claim 16 further comprising the steps of defining the approximate center of the crystal with respect to a reference (x,y) coordinate system and defining a front window region of the image at a position below the y coordinate of the defined center of the crystal and a distance from the defined center of the crystal of approximately half the approximate diameter of the crystal, and the step of processing the image as a function of the pixel values to detect edges within the front window region, said edges detected within the front window region corresponding to the edge of the bright area adjacent the crystal.

18. The method of claim 1 wherein the crystal is pulled from the melt along a longitudinal axis which is substantially perpendicular to the surface of the melt, said camera having an optical axis which is at an acute angle $\alpha$ with respect to the longitudinal axis, and further comprising the step of compensating for distortion of the image caused by the camera angle by scaling the image as a function of $\cos \alpha$.

19. The method of claim 1 wherein the crystal growing apparatus provides for relative movement between the crystal and the crucible and further comprising the steps of controlling the rates at which the crucible, the crystal, or both, are rotated in response to the diameter of the crystal thereby to control the crystal growing apparatus.

20. The method of claim 1 wherein the crystal growing apparatus provides for relative movement between the crystal and the crucible and further comprising the step of controlling the rate at which the crystal is pulled from the melt in response to the diameter of the crystal thereby to control the crystal growing apparatus.

21. The method of claim 1 wherein the crystal growing apparatus provides for relative movement between the crystal and the crucible and further comprising the step of controlling the temperature of the melt in response to the diameter of the crystal thereby to control the crystal growing apparatus.

* * * * *